United States Patent [19]

Carlson

[11] 4,015,928

[45] Apr. 5, 1977

[54] HEATING SYSTEM

[75] Inventor: Elmer A. Carlson, Agoura, Calif.

[73] Assignee: International Telephone and Telegraph Corporation, New York, N.Y.

[22] Filed: Jan. 23, 1976

[21] Appl. No.: 651,635

[52] U.S. Cl. .................................. 431/74; 431/27; 431/78; 431/264; 307/106; 361/257
[51] Int. Cl.² .................... F23N 5/00; F23N 5/24
[58] Field of Search ............... 431/78, 25, 27, 46, 431/71, 74, 264; 307/106; 317/96

[56] References Cited

UNITED STATES PATENTS

| 2,559,490 | 7/1951 | Yates et al. | 431/78 |
| 3,109,936 | 11/1963 | Rennie | 307/106 |
| 3,260,299 | 7/1966 | Lister | 317/96 |
| 3,877,864 | 4/1975 | Carlson | 431/264 |
| 3,975,136 | 8/1976 | Baysinger et al. | 431/27 |

Primary Examiner—Samuel Feinberg
Attorney, Agent, or Firm—A. Donald Stolzy

[57] ABSTRACT

Apparatus including an improved D.C. operated oscillator for an intermediate power source, a cooperating solenoid gas valve opening and safety shut-off circuit, and a spark igniter with automatic shut-down.

4 Claims, 1 Drawing Figure

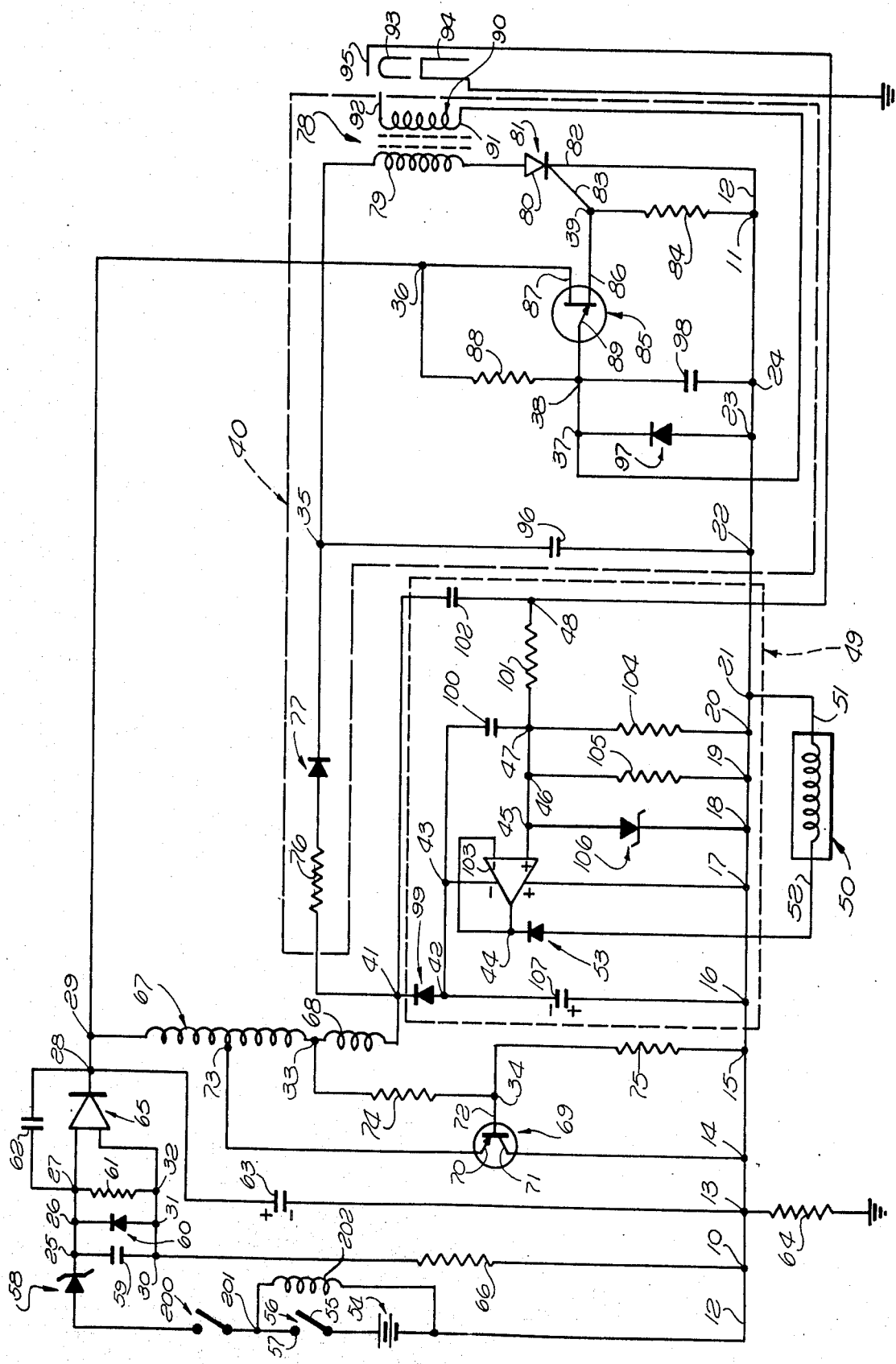

HEATING SYSTEM

BACKGROUND OF THE INVENTION

This invention relates to fluid fuel combustion, and more particularly to a pilotless heating apparatus.

Typical of the foregoing is disclosed in U.S. Pat. No. 3,877,864. The same is true of copending application Ser. No. 512,458 filed Oct. 7, 1974, by Elmer A. Carlson for SPARK IGNITED RECYCLING IGNITION SYSTEM WITH INTERLOCKING GAS VALVE CONTROL.

The said patent discloses a spark igniter for operation off of a D.C. line without a voltage multiplier.

The said copending application discloses both igniter and main valve control off of an A.C. line.

The prior art does not disclose an igniter and main valve control off of a D.C. line.

SUMMARY OF THE INVENTION

In accordance with the system of the present invention, the above-described and other disadvantages of the prior art are overcome by combining an improved D.C. operated oscillator.

The oscillator can operate a spark igniter and/or a main valve control.

The above-described and other advantages of the present invention will be better understood from the following detailed description when considered in connection with the accompanying drawing.

BRIEF DESCRIPTION OF THE DRAWING

The FIGURE is a schematic diagram of the heating system of the present invention.

DESCRIPTION OF THE PREFERRED EMBODIMENT

The system of the present invention is illustrated in the figure including a common line that runs through a junction 10 in a straight line through a junction 11 and is indicated at 12.

Junctions 13, 14, 15, 16, 17, 18, 19, 20, 21, 22, 23 and 24 lie upon and are thereby electrically connected to common line 12.

The figure also contains junctions 25, 26, 27, 28, 29, 30, 31, 32, 33, 34, 35, 36, 37, 38 and 39. Junctions 35-39 will be found in a spark igniter 40.

The figure also contains junctions 41, 42, 43, 44, 45, 46, 47 and 48. Junctions 42-48 will be found in a valve control circuit 49. A main gas valve 50 is provided having one lead 51 connected to junction 21, and another lead 52 connected to junction 44 through a diode 53 which is poled to be conductive in a direction toward junction 44.

A D.C. source of potential is provided at 54. Source 54 is connected from common 12 to a pole 55 of a switch 56, switch 56 having a contact 57.

A conventional sale switch 200 employed in the air supply conduit to the main burner, and a zener diode 58 are connected in that order from switch contact 57 to junction 25. Junctions 25, 26 and 27 are connected together. Similarly, junctions 30, 31 and 32 are connected together. A capacitor 59 is connected between junctions 25 and 30. A diode 60 is connected between junctions 26 and 31, and is poled to be conductive toward junction 26. A resistor 61 is connected between junctions 27 and 32. A capacitor 62 is connected between junctions 27 and 28. A capacitor 63 is connected between junctions 28 and 13. A resistor 64 is connected between junction 13 and ground. A programmable unijunction transistor is illustrated at 65 having an anode connected from junction 27, a gate connected from junction 32, and a cathode connected from junction 28.

A blower fan relay winding 202 is connected from a junction 201 to the negative pole of source 54.

When switches 56 and 200 are closed and the switch 56 is opened, the inductive kick of winding 200 resets the pre-purge circuit (25-29 and 54-64) immediately.

A resistor 66 is connected between junctions 30 and 10. Inductors are illustrated at 67 and 68, inductor 67 being connected between junctions 29 and 33, inductor 68 being connected between junctions 33 and 41. A transistor 69 is provided having an emitter 70, a collector 71 and a base 72, base 72 being connected to junction 34. Emitter 70 is connected from a tap 73 on winding 67. Collector 71 is connected to junction 14. A resistor 74 is connected between junctions 33 and 34. A resistor 75 is connected between junctions 34 and 15.

In spark igniter 40, a resistor 76 and a diode 77 are connected in that order in succession in series from junction 41 to junction 35.

Igniter 40 has a conventional ferrite core transformer 78 with a primary 79 connected from junction 35 to an anode 80 of a silicon controlled rectifier (SCR) 81. SCR 81 also has a cathode 82 and a gate 83. Cathode 82 is connected to common 12. Gate 83 is connected to junction 39. A resistor 84 is connected between junctions 39 and 11.

A unijunction transistor is provided at 85 having a first base 86 connected to junction 39, and a second base 87 connected to junction 36. A resistor 88 is connected between junctions 36 and 38. Junctions 28, 29 and 36 are connected together. Junctions 37 and 38 are connected together.

Transistor 85 has an emitter 89 connected from junction 38.

Transformer 78 has a secondary 90 with a lower end 91 and an upper end 92. Lower end 91 is connected to junction 37 and serves to stop the spark when a flame exists at 93, flame 93 making a moderately high, but effective ground connection from upper secondary end 92 to a burner at 94 which is connected to ground.

A flame rod 95 enables control 49 during the existence of flame 93, the action of flame rod 95 and the construction thereof being conventional. Flame rod 95 is connected to junction 48 in control 49.

A capacitor 96 is connected between junctions 35 and 22. A diode 97 is connected between junctions 37 and 23 and is poled to be conductive toward junction 37. A capacitor 98 is connected between junctions 38 and 24.

In control 49, a diode 99 is connected between junctions 41 and 42, and is poled to be conductive toward junction 41. Junctions 42 and 43 are connected together. A capacitor 100 is connected between junctions 43 and 47. Junctions 45, 46 and 47 are connected together. A resistor 101 is connected between junctions 47 and 48. A capacitor 102 is connected between junctions 41 and 48. A differential amplifier 103 is provided having its output connected to junction 44, and therethrough to the inverting input thereof. The non-inverting input to amplifier 103 is connected from junction 45. A resistor 104 is connected between junctions 47 and 20. A resistor 105 is connected between junctions 46 and 19. The combined parallel resistance of resistors 105 and 104 may be included in a single resistor to be substituted therefor, if desired. A zener diode is provided at 106 and is connected between junctions 45 and 18. Zener diode 106 is back biased by the negative potential appearing upon junction 45 relative to the positive potential appearing at junction 18. A capacitor 107 is connected between junctions 42 and 16.

OPERATION

In the operation of the present invention shown in the figure, switch 56 may be closed by a thermostat or otherwise. Programmable unijunction transistor 65 then supplies a necessary voltage and current to cause the combination of windings 67 and 68, capacitor 63, resistors 74 and 75, and transistor 69 to oscillate. The oscillator supplies a voltage to charge capacitor 96 in spark igniter 40.

Junction 29 is connected to junction 36. Thus, when junction 36 reaches a potential sufficiently high, the same being true of junction 38 while capacitor 98 charges, transistor 85 will fire, and, in turn, will fire SCR 81. This will cause transformer primary 79 to conduct and tend to oscillate in conjunction with capacitor 96. A spark will then be discharged from electrode 92 to burner 94 to ignite gas emanating from burner 94. Diode 77 rectifies current to charge capacitor 96. The same is true of resistor 76.

Each time capacitor 96 is charged, and capacitor 98 is charged sufficiently, a spark jumps from electrode 92 to burner 94. This continues until flame 93 is ignited. In this case, the resistance between electrode 92 and burner 94 is lowered and, by the connection of the end 91 of transformer secondary 90 to junction 37, capacitor 98 is no longer permitted to charge to a value sufficient to fire transistor 85 or SCR 81. This occurs so long as flame 93 is ignited.

No gas to be ignited emanates from burner 94 unless control 49 is operated properly. It is so operated because the potential at junction 41 pulsates in a positive direction, and the inductive kick of the winding of valve 50 tends to hold it on momentarily. If ignition occurs, the flame 93 connects, with a moderately high resistance, the grounded burner 94 and the flame rod 95. This increases the negative potential at junction 48 and the non-inverting input of differential amplifier 103 to sustain ample current through the winding of main valve 50 to keep the main valve open.

If flame 93 is not ignited in a reasonable time, junction 48 will rise due to the connection of capacitor 100 thereto, and main valve 50 will be shut off until whatever problem has caused the failure of ignition is corrected.

Resistor 64 may be 1,000 ohms or zero ohms. Resistor 64 therefore is optional. The same is true of zener diode 106. The oscillator including windings 67 and 68 may be operated between 5.0 and 10.0 kilohertz, if desired.

Source 54 may, if desired, be a 12-volt D.C. source of potential.

Diode 97 may also be optional. If desired, it may be employed to improve the timing of unijunction transistor 85, and protect the same from reverse current during spark oscillation.

The circuit between flame rod 95 and ground may be considered to be, effectively, a diode and resistor connected in series to ground. The diode may be considered to be poled in a direction toward ground. The effective resistance may be 2 megohms. This is true when flame 93 is ignited. The circuit between flame rod 95 and ground when no flame 93 exists may be considered to be an open circuit.

Resistor 61 may be optional. The same is true of diode 60.

The values of the circuit elements may be as follows:

| | |
|---|---|
| Capacitor 59 | 15 microfarads |
| Capacitor 62 | 500 picofarads |
| Capacitor 63 | 15 microfarads |
| Capacitor 96 | 2.2 microfarads |
| Capacitor 98 | .05 microfarads |
| Capacitor 100 | 22 microfarads |
| Capacitor 102 | 500 picofarads |
| Capacitor 107 | 33 microfarads |
| Differential amplifier 103 | LM307 |
| Diode 53 | 1N4148 |
| Diode 58 | 1N972 |
| Diode 60 | 1N4148 |
| Diode 77 | 1N4148 |
| Diode 97 | 1N4148 |
| Diode 99 | 1N4004 |
| Programmable unijunction transistor 65 | 2N6029 |
| Resistor 66 | 68 megohms ± 10 percent |
| Resistor 74 | 470 ohms |
| Resistor 75 | 4,700 ohms |
| Resistor 76 | 150 ohms |
| Resistor 84 | 47 ohms |
| Resistor 88 | 6.8 megohms ± 10 percent |
| Resistor 101 | 2 megohms |
| Resistor 104 | 20 megohms ± 10 percent |
| Resistor 105 | 20 megohms ± 10 percent |
| Transistor 69 | MPS 051 |
| Unijunction transistor 85 | 2N4851 |

What is claimed is:

1. A heating system comprising: first and second main input leads; first means for impressing a D.C. voltage between said main input leads; a transformer having first and second inductive windings, each having first and second ends, said first inductive winding having a tap, said first inductive winding first end being connected to said first main input lead, said first inductive winding second end being connected to said second inductive winding first end at a first junction; a first transistor having a base, an emitter and a collector; a first resistor connected between said first junction and said base, said emitter being connected to said tap, said collector being connected to said second main input lead; a second resistor connected between said base and said second main input lead; a first capacitor connected between said first and second main input leads; a conductive fluid fuel burner connected to said second main input lead; a fuel valve actuable to admit fuel to said burner; second means connected between said second inductive winding second end and said second main input lead actuable when said voltage is impressed as aforesaid to actuate said valve; and third means actuable when said voltage is impressed as aforesaid to ignite the fuel emanating from said burner.

2. The invention as defined in claim 1, wherein said second means includes a differential amplifier having inverting and non-inverting input leads and first and second power input leads, and an output lead, second, third, fourth, fifth and sixth junctions, a first diode connected from said second winding second end to said second junction, said second and third junctions being connected together, a second capacitor connected from said second junction to said second main input lead, said amplifier output and inverting input leads being connected to said fourth junction, said amplifier first power input lead being connected to said third junction, said amplifier second power input lead being connected to said second main input lead, a second diode having first and second electrodes, said first electrode of said second diode being connected to said fourth junction, said fuel valve having an operating winding connected from said second diode second electrode to said second main input lead, a third capacitor connected between said third and fifth junctions, a fourth capacitor connected from said second winding second end to said sixth junction, a third resistor connected between said fifth and sixth junctions, a fourth resistor connected from said fifth junction to said second main input lead, and a flame rod mounted adjacent said fuel burner and connected to said sixth junction.

3. The invention as defined in claim 2, including a control circuit connected in parallel with said first capacitor, said control circuit including a programmable unijunction transistor (PUT) having an anode, a cathode and a gate, an auxiliary input lead and seventh, eighth, ninth and tenth junctions, said auxiliary input lead being connected to said seventh junction, said eighth junction and said anode, a fifth capacitor connected between said seventh and ninth junctions, a third diode connected between said eighth and tenth junctions and poled to be conductive toward said eighth junction, said gate being connected from said tenth junction, said cathode being connected to one of said main input leads, a fifth resistor connected from said ninth junction to the other of said main input leads, and a sixth capacitor connected from said eighth junction to said one main input lead.

4. The invention as defined in claim 1, including a control circuit connected in parallel with said first capacitor, said control circuit including a programmable unijunction transistor (PUT) having an anode, a cathode and a gate, an auxiliary input lead and second, third, fourth and fifth junctions, said auxiliary input lead being connected to said second junction, said third junction and said anode, a second capacitor connected between said second and fourth junctions, a first diode connected between said third and fifth junctions and poled to be conductive toward said third junction, said gate being connected from said fifth junction, said cathode being connected to one of said main input leads, a third resistor connected from said fourth junction to the other of said main input leads, and a third capacitor connected from said third junction to said one main input lead.

* * * * *